(12) United States Patent
Tajic

(10) Patent No.: US 9,450,565 B2
(45) Date of Patent: Sep. 20, 2016

(54) BORDER RING MODE SUPPRESSION IN SOLIDLY-MOUNTED BULK ACOUSTIC WAVE RESONATOR

(71) Applicant: TRIQUINT SEMICONDUCTOR, INC., Hillsboro, OR (US)

(72) Inventor: Alireza Tajic, Winter Springs, FL (US)

(73) Assignee: Qorvo US, Inc., Greensboro, NC (US)

(*) Notice: Subject to any disclaimer, the term of this patent is extended or adjusted under 35 U.S.C. 154(b) by 599 days.

(21) Appl. No.: 13/796,824

(22) Filed: Mar. 12, 2013

(65) Prior Publication Data

US 2014/0273881 A1 Sep. 18, 2014

(51) Int. Cl.
| | |
|---|---|
| *H03H 9/70* | (2006.01) |
| *H03H 9/15* | (2006.01) |
| *H03H 9/54* | (2006.01) |
| *H03H 9/13* | (2006.01) |
| *H03H 9/58* | (2006.01) |
| *H03H 9/02* | (2006.01) |
| *H03H 9/17* | (2006.01) |

(52) U.S. Cl.
CPC .......... *H03H 9/703* (2013.01); *H03H 9/02118* (2013.01); *H03H 9/131* (2013.01); *H03H 9/132* (2013.01); *H03H 9/175* (2013.01); *H03H 9/589* (2013.01); *H03H 9/706* (2013.01); *Y10T 29/42* (2015.01)

(58) Field of Classification Search
CPC .......... H03H 9/02086; H03H 9/0211; H03H 9/02118; H03H 9/131; H03H 9/132; H03H 9/17; H03H 9/171; H03H 9/175; H03H 3/02; H03H 9/589; H03H 9/54; H03H 9/58; H03H 9/582; H03H 9/703; H03H 9/706; Y10T 29/42
USPC .......................................... 333/187, 189, 133
See application file for complete search history.

(56) References Cited

U.S. PATENT DOCUMENTS

| | | | |
|---|---|---|---|
| 6,812,619 B1 | 11/2004 | Kaitila | |
| 6,936,837 B2 * | 8/2005 | Yamada et al. | .................... 257/2 |
| 7,466,213 B2 * | 12/2008 | Lobl et al. | ..................... 333/187 |
| 8,008,993 B2 * | 8/2011 | Milsom et al. | ............... 333/187 |
| 8,198,958 B1 * | 6/2012 | Aigner | .................... H03H 9/542 310/322 |
| 2009/0045703 A1 * | 2/2009 | Barber | ..................... H03H 3/02 310/364 |
| 2009/0045704 A1 * | 2/2009 | Barber | ................... H03H 9/131 310/364 |
| 2009/0206706 A1 * | 8/2009 | Iwaki et al. | ................... 310/365 |
| 2011/0037539 A1 * | 2/2011 | Jansman et al. | .............. 333/187 |
| 2011/0298564 A1 * | 12/2011 | Iwashita et al. | .............. 333/187 |
| 2012/0299664 A1 * | 11/2012 | Hara et al. | ...................... 333/133 |
| 2014/0118091 A1 * | 5/2014 | Burak | .................... H03H 9/173 333/187 |

* cited by examiner

*Primary Examiner* — Barbara Summons
(74) *Attorney, Agent, or Firm* — Withrow & Terranova, P.L.L.C.

(57) ABSTRACT

Embodiments provide a solidly-mounted bulk acoustic wave (BAW) resonator and method of making same. In embodiments, the BAW resonator may include one or more extensions that are acoustical similar to active region components of the BAW resonator. Other embodiments may be described and claimed.

28 Claims, 6 Drawing Sheets

BORDER RING MODE SUPPRESSION IN SOLIDLY-MOUNTED BULK ACOUSTIC WAVE RESONATOR

FIELD

Embodiments of the present disclosure relate generally to the field of resonators, and more particularly to border ring mode suppression in solidly-mounted bulk acoustic wave resonators.

BACKGROUND

Lateral acoustic waves, also referred to as Lamb waves, may propagate through portions of a bulk acoustic wave (BAW) resonator due to finite lateral dimensions of the BAW resonator structure. This may result in part of the energy contained in a fundamental thickness mode leaking to lateral modes, which results in a degradation of a quality factor of the BAW resonator. Lateral acoustic waves may become evident in electrical behavior of the BAW resonator in the form of spurious resonances leading to strong ripples in the bandpass frequencies.

Performance of a BAW resonator may be improved by creating a region with specific boundary conditions in which lateral acoustic waves cannot propagate. For dispersion type I resonators, this may be done by including a thickened edge load, known as a border ring (BO), in a perimeter of an active region of the BAW resonator. Presence of the thickened edge enables the mismatch between the active and external regions to be avoided, providing a smooth transition of propagating waves in the active region to evanescent waves in the external region.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Figure 1:
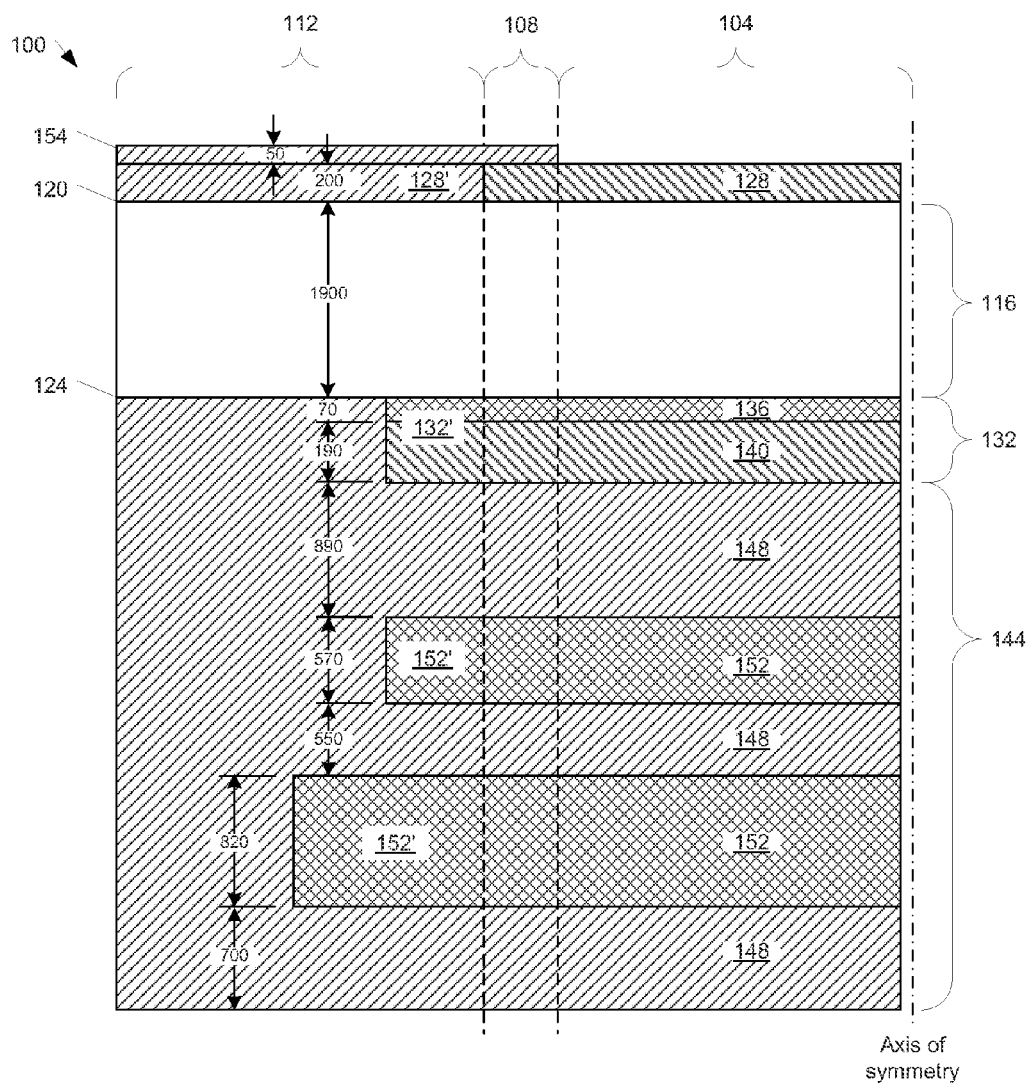
FIG. 1 illustrates a BAW resonator in accordance with some embodiments.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms comprising, having, and including are synonymous, unless the context dictates otherwise.

The phrase "coupled with," along with its derivatives, may be used herein. Coupled may mean that two or more elements are in direct physical or electrical contact. However, coupled may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer," may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

As discussed above, lateral energy leakage within a BAW resonator may lead to spurious resonances in a bandpass and lead to a degradation of the quality factor of the BAW resonator. A border ring, that is, an electrode-thickened edge load, may be used to suppress the spurious modes. A resonator quality factor, $Q_p$, may be maximized at a BO width and mass associated with the highest levels of spurious mode suppression. However, such a BO width and mass may result in undesired BO mode, which may be in a filter's bandpass. This may effectively limit the BO width and mass in series resonators and therefore, result in a lower quality factor and some remaining spurious modes in an upper side of a filter's bandpass.

Embodiments of the present disclosure provide a BAW resonator having external-region extensions corresponding to layers of the active region. These extensions may be acoustically similar to their active-region counterpart. This may allow BO regions of a desired width and mass to provide a high level of spurious mode suppression without the corresponding BO mode being introduced into a filter's bandpass.

FIG. 1 illustrates a BAW resonator 100 in accordance with some embodiments of the disclosure. The BAW resonator 100 may include an active region 104, a border (BO) region 108, and an external region 112. The BAW resonator 100 may have an axis of symmetry located along the right-hand side as shown.

The active region 104 may be the part of the BAW resonator 100 that is electrically driven. The BO region 108 may be a thickened edge load in a perimeter of the active region 104. And the external region 112 may be the part of the BAW resonator 100 that is not electrically driven.

The BAW resonator 100 may further include a piezoelectric layer 116 having a first surface 120 and an opposite second surface 124. The piezoelectric layer 116 may be an aluminum nitride (AlN) layer.

A top electrode 128 may be coupled with the first surface 120 of the piezoelectric layer 116. The top electrode 128 may be an aluminum copper (AlCu) layer.

A bottom electrode 132 may be coupled with the second surface 124 of the piezoelectric layer 116. The bottom electrode 132 may include a plurality of layers, for example, layer 136 and layer 140. In some embodiments, layer 140 may be an AlCu layer; while the layer 136 may be a tungsten (W) layer.

The BAW resonator 100 may further include a reflector 144 coupled with the piezoelectric layer 116 and the bottom electrode 132. The reflector 144 may have alternating layers of a dielectric element 148, for example, silicon dioxide ($SiO_2$), and a conductive element 152, for example, tungsten. In some embodiments, the reflector 144 may be a Bragg reflector.

The thickness of the layers of the BAW resonator 100 are shown in FIG. 1 in accordance with some embodiments. In particular, the top electrode 128 may have a thickness of approximately 200 nanometers, the piezoelectric layer 116 may have a thickness of approximately 1900 nanometers, and the layers 136 and 140 may have respective thicknesses of approximately 70 and 190 nanometers. The layers of the reflector 144 may be tuned for the frequency range of interest. In some embodiments, a thickness of the dielectric layer 148 between bottom electrode 132 and conductive layer 152, may be approximately 890 nanometers, the thickness of the top conductive layer 152 may be approximately 570 nanometers, the thickness of the dielectric material 148 between the conductive layers 152 may be approximately 550 nanometers, the thickness of the bottom conductive layer 152 may be approximately 820 nanometers, and the thickness of the dielectric material 148 under the bottom conductive layer 152 may be approximately 700 nanometers. These thicknesses may vary in different embodiments in order to tune resonator performance to meet objectives of a particular implementation.

Embodiments of the present disclosure provide a high-level of spurious mode suppression with little or no BO-mode side effect by bringing a cut-off, or anti-resonance frequency, $f_{Ext}$, of the external region 112 close to an anti-resonance frequency, $f_p$, of the active region 104, provided that $f_{Ext} > f_p$. This may be done, in part, by ensuring that each layer in the active region 104 has an acoustically similar layer in the external region 112. A layer may be acoustically similar with another layer if they have similar acoustic impedances. In some embodiments, an acoustical impedance of an external layer, $Z_{ext}$, may be considered similar to an acoustical impedance of an active layer, $Z_{act}$, if $0.7 < Z_{ext}/Z_{act} < 1.3$.

To this end, the BAW resonator 100 may further include extension 128' that has an acoustical impedance similar to that of the top electrode 128, extension 132' that has an acoustical impedance similar to that of the bottom electrode 132, and extensions 152' that have acoustical impedances similar to that of the layers 152 of the reflector 144. The extensions 128' and 132' may be coupled with respective surfaces 120 and 124 of the piezoelectric layer 116.

The extensions of the BAW resonator 100 may improve the mode matching at the interface between the external region 112 and the BO region 108, resulting in a smooth transition of lateral waves from propagating to evanescent. Such a smooth transition may be achievable through introduction of a less pronounced BO region 108, in terms of width and mass. This reduces or eliminates a BO mode signature that could result from having a more pronounced BO region.

In the BAW resonator 100, the presence of tungsten in electrodes may be desired to obtain high coupling. However, there may be limited or no dielectric materials that are acoustically similar to tungsten. Therefore, embodiments of the present disclosure provide some electrodes without tungsten, for example, top electrode 128, and others with tungsten, for example, bottom electrode 132. For the layers that do not include tungsten, for example, top electrode 128, an acoustically similar dielectric material may be present in the external region 112, for example, 128'. The external region 128' may be composed of silicon dioxide, which may be a dielectric material acoustically similar to aluminum copper.

For layers that do include tungsten, for example, bottom electrode 132 and layers 152, the layers may be extended into the external region 112. In these cases, the portion of the layer within the external region 112 may be considered the extension. The length that a particular layer is extended into the external region 112 may vary. In some embodiments, the bottom electrode 132 and layer 152 may extend approximately 2-3 microns into the external region 112.

Due to the acoustical similarity of the active region 104 and the external region 112, an anti-resonance frequency of the external region 112 may be comparable to the anti-resonance frequency of the active region 104. A value of $\Delta f_{Ext}$, which may represent a difference between the anti-resonance frequency of the external region 112 and the anti-resonance frequency of the active region 104, may be tuned by adjusting relative thicknesses of the electrodes 128 and 132 and the topmost conductive layer 152 of reflector 144 and by extending or not extending a BO mass load into the external region 112 (discussed below). The BAW resonator 100, with the dimensions shown, may have a $\Delta f_{Ext}$ of approximately 57 MHz. In contrast, a BAW resonator that does not include the extensions 128' and 132' may have a $\Delta f_{Ext}$ of 183 MHz.

Characteristics of the BO region 108 may include $\Delta f_{BO}$, which may represent a difference between the resonance frequency of the BO region 108 and the resonance frequency of the active region 104, and $W_{BO}$, which may represent a width of the BO region 108. The BAW resonator 100 may have lower $W_{BO}$ and $\Delta f_{BO}$ as compared to other BAW resonators, thereby offering an increased level of spurious mode suppression with decreased BO mode. In some embodiments, the BAW resonator 100 may have a $\Delta f_{BO}$ of approximately 40 MHz (as compared to a $\Delta f_{BO}$ of 60 MHz for a BAW resonator having a similar design without the extensions); and a $W_{BO}$ of approximately 2.0 microns (as compared to a $W_{BO}$ of 3.25 microns for a BAW resonator having a similar design without the extensions).

The BAW resonator 100 may also include a mass load 154. In this embodiment, the mass load 154 may be disposed in both the BO region 108 and the external region 112 and be coupled with the top electrode 128 and extension 128'. In other embodiments, see FIG. 3 for example, a mass load may only be disposed in a BO region. In some embodiments, the mass load may be extended into the external region to reduce the frequency shift $\Delta f_{Ext}$.

The mass load 330 may be any process-available material suitable for the design. The choice of material sets the thickness of the mass load 330 desired to achieve the right frequency shift $\Delta f_{BO}$ in order to suppress spurious modes effectively. The thickness shown in FIG. 1 is 50 nanometers; however this may change in other embodiments. In some embodiments, the material may be the same as that of the underlying extension 128', that is, $SiO_2$ in this embodiment. However, in other embodiments the material may be different.

The lower $\Delta f_{BO}$ of BAW resonator 100, as compared to other BAW resonators, corresponds to having less BO mass.

Thus, the mass load 154 can be made by a material with lower mass density, or the thickness may be adjusted toward lower values.

Figure 2:
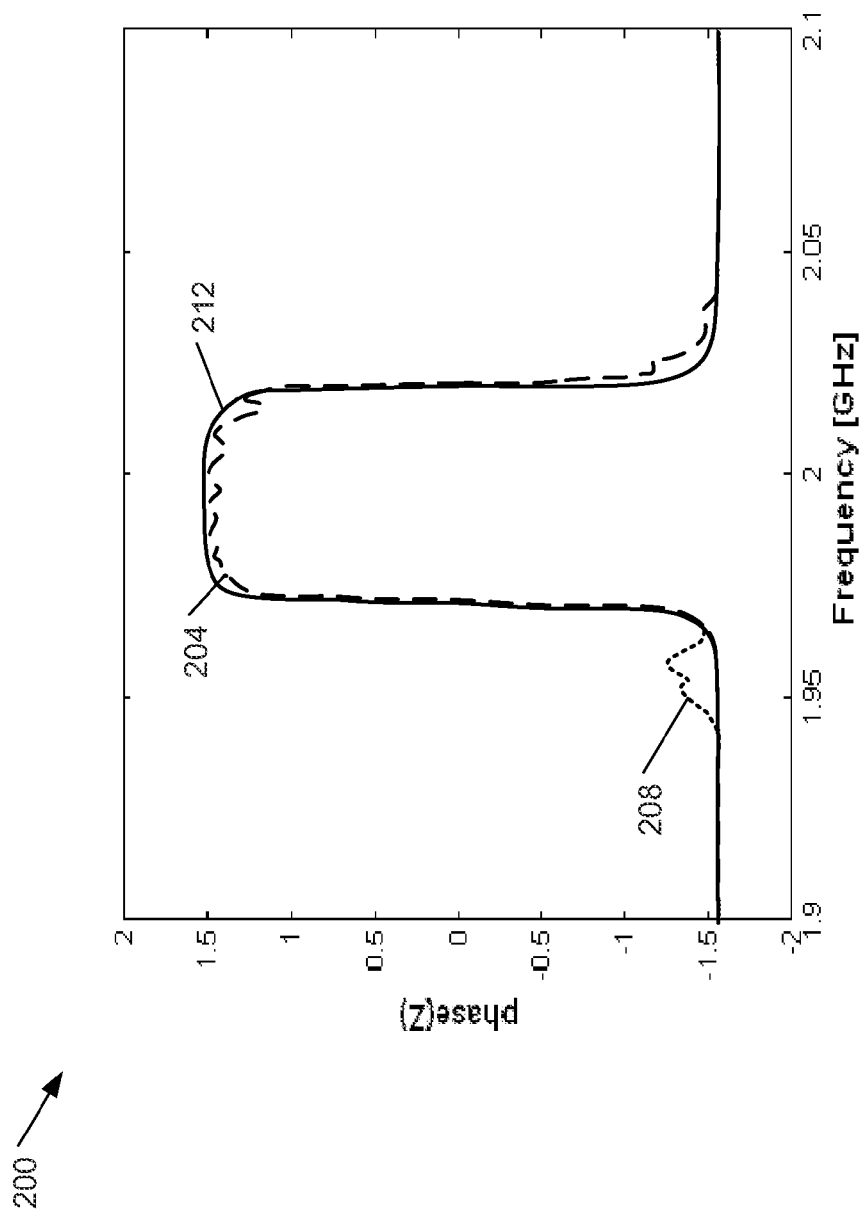
FIG. 2 is a graph illustrating BAW resonator performance in accordance with some embodiments.

FIG. 2 is a graph 200 illustrating resonator performance in accordance with some embodiments. Line 204 illustrates an electrical response of a BAW resonator that does not include a BO region. As can be seen, a spurious mode signature exists within the bandpass of the resonator. Line 208 illustrates an electrical response of a BAW resonator that includes a BO region having a BO width and mass set for desired spurious mode suppression, but not having the extensions as taught by the present embodiments. While the spurious mode is suppressed within the bandpass of the resonator, there exists a BO mode, at approximately 1.96 GHz, that is generated. This BO mode may be within a bandpass of a filter into which the BAW resonator is employed, thereby leading to decreased filter performance.

Line 212 illustrates performance of the BAW resonator 100 in accordance with some embodiments. With the extensions provided in the external region, the BAW resonator 100 is able to achieve desired spurious mode suppression using a BO region that is narrower and lighter than that used in BAW resonator associated with line 208, for example, without the corresponding BO mode.

Figure 3:
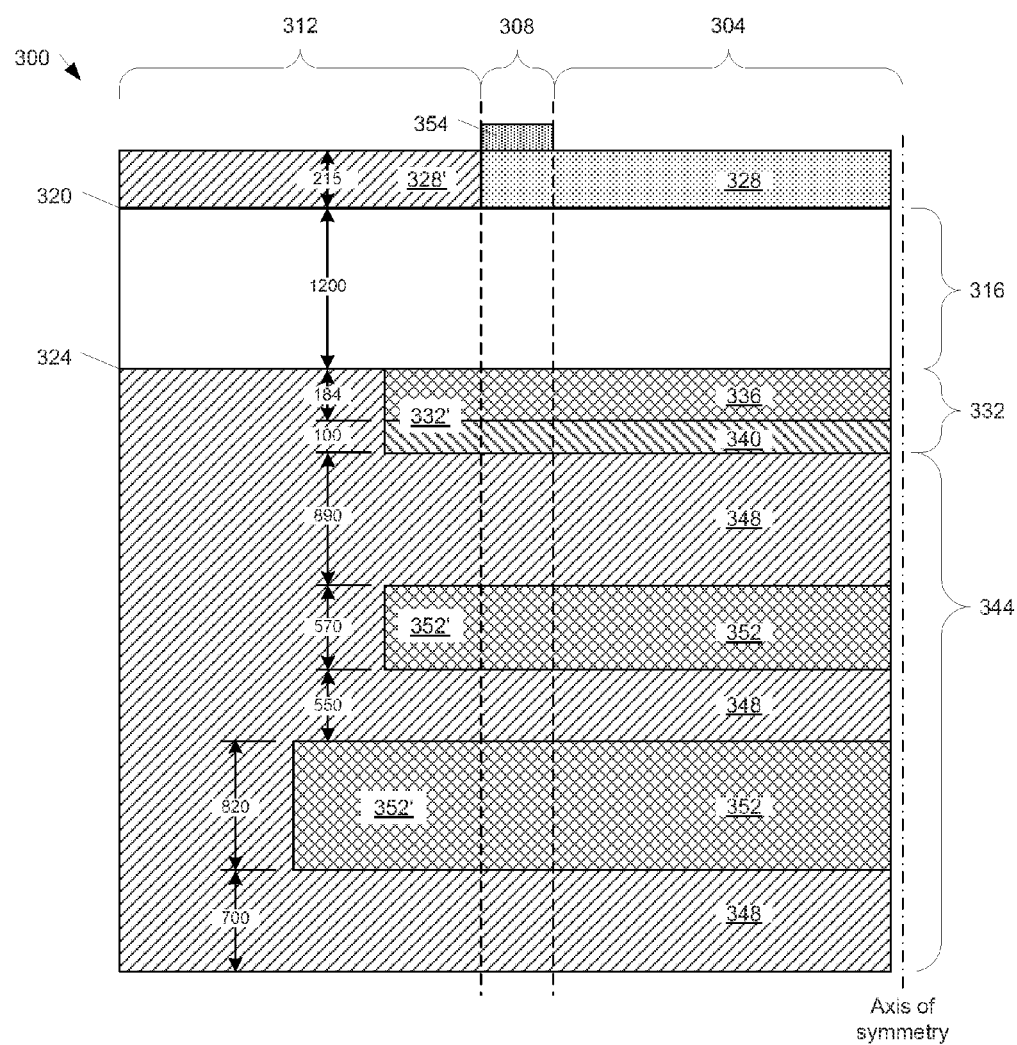
FIG. 3 illustrates a BAW resonator in accordance with some embodiments.

FIG. 3 illustrates a BAW resonator 300 in accordance with some embodiments of the disclosure. The BAW resonator 300 may be similar to BAW resonator 100 with elements having reference numbers with the same ones and tens place values being similar, except as otherwise noted. For example, reflector 344 may be similar to reflector 144.

In the BAW resonator 300, the top electrode 328 may be a molybdenum (Mo) layer, rather than an AlCu layer. The top electrode 328 may be planarized with an extension 328' that may be a hafnium oxide ($HfO_2$) layer, due to the acoustic similarities of $HfO_2$ and Mo. The BAW resonator 300 may include a mass load 354 coupled to the top electrode 328 in the BO region 308.

The BAW resonator 300 may have a resonance frequency that is similar to a resonance frequency of the BAW resonator 100 by appropriate adjustment of the thicknesses of the top electrode 328, the bottom electrode 332, and the piezoelectric layer 316. In particular, the top electrode 328 may have a thickness of approximately 215 nanometers, the piezoelectric layer 316 may have a thickness of approximately 1200 nanometers, and the layers 336 and 340 may have respective thicknesses of approximately 184 and 100 nanometers. The layers of the reflector 344 may be unchanged, as they may already be tuned for the frequency range of interest.

The BAW resonator 300 may have a $\Delta f_{Ext}$ of approximately 196 MHz (as compared to a $\Delta f_{Ext}$ of a 387 MHz for a BAW resonator having a similar design without the extensions); a $\Delta f_{BO}$ of approximately 40 MHz (as compared to a $\Delta f_{BO}$ of 50 MHz for a BAW resonator having a similar design without the extensions); and a $W_{BO}$ of approximately 2.0 microns (as compared to a $W_{BO}$ of 3.5 microns for a BAW resonator having a similar design without the extensions).

Figure 4:
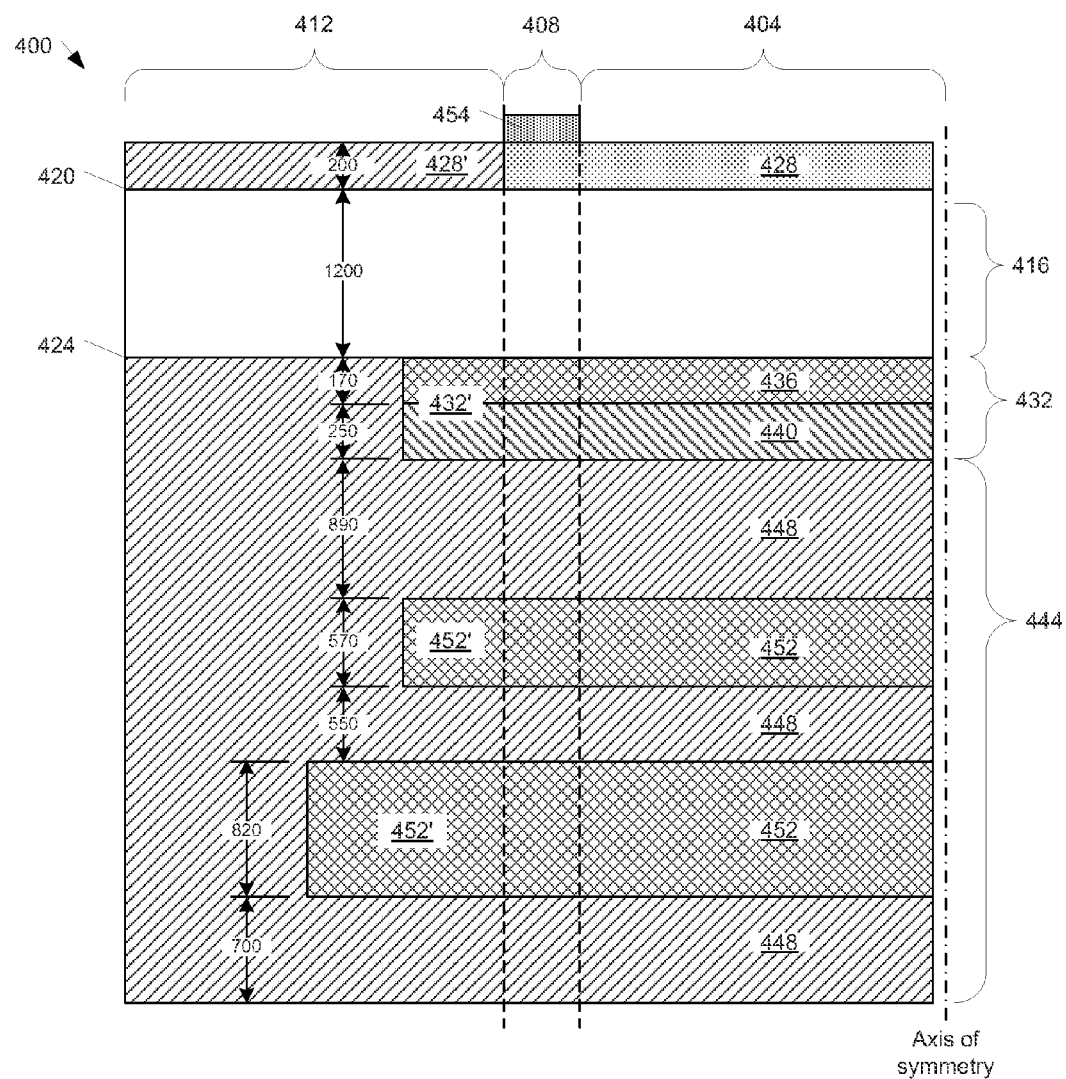
FIG. 4 illustrates a BAW resonator in accordance with some embodiments.

FIG. 4 illustrates a BAW resonator 400 in accordance with some embodiments of the disclosure. The BAW resonator 400 may be similar to BAW resonator 300 with elements having reference numbers with the same ones and tens place values being similar, except as otherwise noted.

The BAW resonator 400 may include a top electrode 428 that is a MO layer; and an extension 428' that is $HfO_2$, similar to the BAW resonator 300. However, the anti-resonance frequency of the external region 412 of the BAW resonator 400 may be moved closer to the anti-resonance frequency of the active region 404, as compared to BAW resonator 300, by adjusting relative electrode thicknesses. In particular, the BAW resonator 400 may have a $\Delta f_{Ext}$ of approximately 49 MHz by setting the thickness of the top electrode 428 to approximately 200 nanometers, the thickness of the layer 436 to approximately 170 nanometers, and the thickness of the layer 440 to approximately 250 nanometers. The BAW resonator 400 may have a $\Delta f_{BO}$ of approximately 130 MHz and a $W_{BO}$ of approximately 0.25 microns.

In this embodiment, the mass load 454 may be different material from that of the underlying extension 428', that is $HfO_2$. Were $HfO_2$ to be used for the mass load 454, a large mass loading may be needed to achieve a desired BO-frequency shift of 130 MHz, for example. Rather a material with a higher mass density may be used, such as tungsten, to obtain such a large frequency shift with a reasonable BO-thickness. The tungsten mass load 454 would not be extended into the external region 412 to avoid creating a capacitance between the BO extension and the extension 432'.

Figure 5:
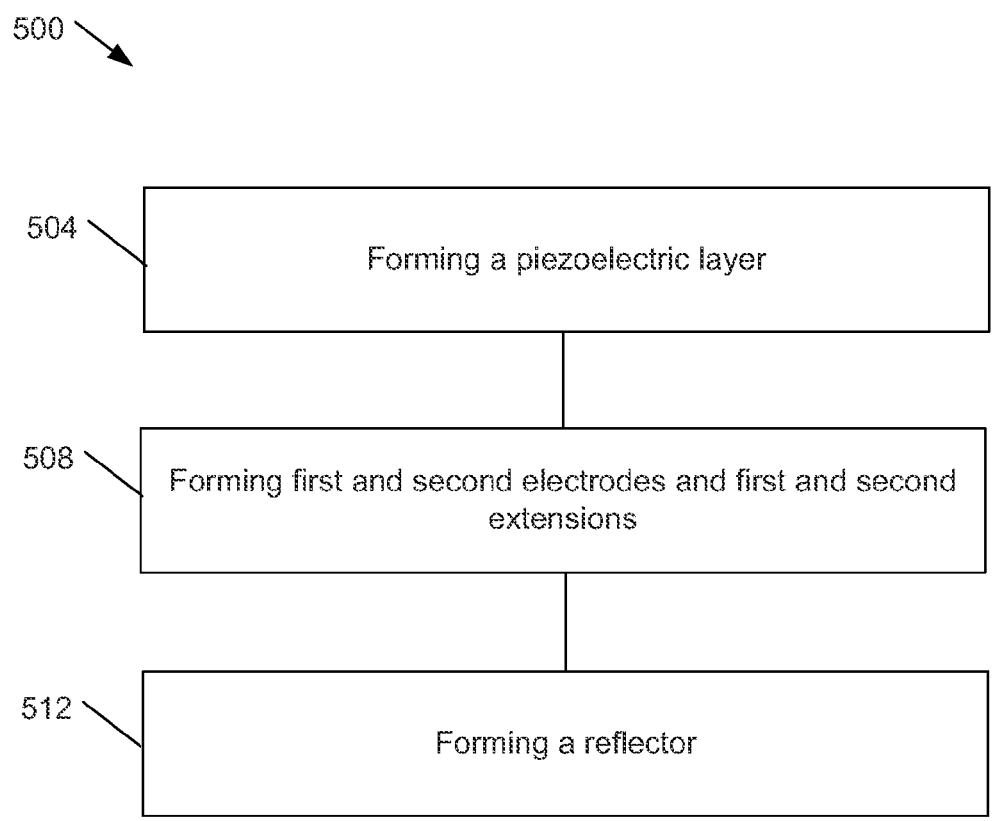
FIG. 5 is a flowchart depicting a manufacturing operation of a BAW resonator in accordance with some embodiments.

FIG. 5 is a flowchart illustrating an operation 500 of manufacturing a BAW resonator in accordance with some embodiments. The manufactured BAW resonator may be the BAW resonators 100, 300, or 400.

At 504, the operation 500 may include forming a piezoelectric layer. The piezoelectric layer may be the piezoelectric layer 116, 316, or 416. The piezoelectric layer may be composed of aluminum nitride.

At 508, the operation 500 may include forming first and second electrodes on respective first and second surfaces of the piezoelectric layer. The formed electrodes may be top electrodes, for example, top electrodes 128, 328 or 428, and bottom electrodes, for example, bottom electrodes 132, 332, or 432. The first and second electrodes may be composed of a conductive material such as, but not limited to, AlCu or Mo.

At 508, the operation 500 may further include forming first and second extensions on respective first and second surfaces of the piezoelectric layer. The formed extensions may be extensions corresponding to the top electrodes, for example, extensions 128', 328', or 428'; or extensions corresponding to the bottom electrodes, for example, extensions 132', 332', or 432'. The extensions, as discussed above, may be composed of a material that has an acoustic impedance similar to an active region counterpart of the extension. The extensions may be composed of a dielectric material, for example, $SiO_2$, or of a conductive material, for example, AlCu or W.

At 512, the operation 500 may include forming a reflector. The reflector may be the reflector 144, 344, or 444. The extensions may be composed of alternating layers of a conductive material, for example, W, and a dielectric material, for example, $SiO_2$.

The various forming steps of operation 500 may be done with any types of suitable materials, thicknesses, or processes. In some embodiments, the forming processes may include, but is not limited to, deposition (for example, chemical vapor deposition, physical vapor deposition, etc.), growth, provision, etc. The forming steps may be done in the order presented in FIG. 5, or in another order. For example, in some embodiments the forming steps may be generally performed from the bottom up. That is, the reflector is formed first, then the bottom electrode and its extension, then the piezoelectric layer, then the top electrode and its extension, and then the mass load.

While the embodiments shown and described herein provide specific compositions and arrangements of the components of a BAW resonator, they are illustrative and not restrictive. The disclosed concepts apply to a wide variety of BAW resonator designs that provide mode matching between the active and external regions through the BO region. As taught and described, the mode matching can be achieved by extending each layer in the active region with its acoustical counterpart into the external region.

The electrodes of the described embodiments can be single or multi-layer built from any conductive materials depending on the design objectives. While specific embodiments show the electrodes having a specific number of layers and composition, this disclosure applies more broadly. For example, some embodiments may include a BAW resonator with an AlCu/MO bottom electrode and an AlCu top electrode. In this case, an extension of $SiO_2/HfO_2$ layers may correspond to the bottom electrode; and an extension of $SiO_2$ may correspond to the top electrode. While the extension corresponding to the bottom electrode may be the same material as the bottom electrode, e.g., AlCu/Mo; in some embodiments it may be desirable that the extension be composed of dielectric acoustical counterparts to AlCu/Mo to reduce an amount of parasitic capacitance between the bottom electrode extension and the top electrode leads that may be used to connect the top electrode to the probing pads.

In some embodiments, it may be difficult to provide a dielectric acoustical counterpart to the electrode material of the active region, e.g., when the electrode of the active region includes tungsten or other conductive material with very high acoustical impedance. In these embodiments, the extension may be composed of the same material as the electrode to satisfy the desire of having an extension with at least a similar acoustic impedance (which in this instance would be the same).

Figure 6:
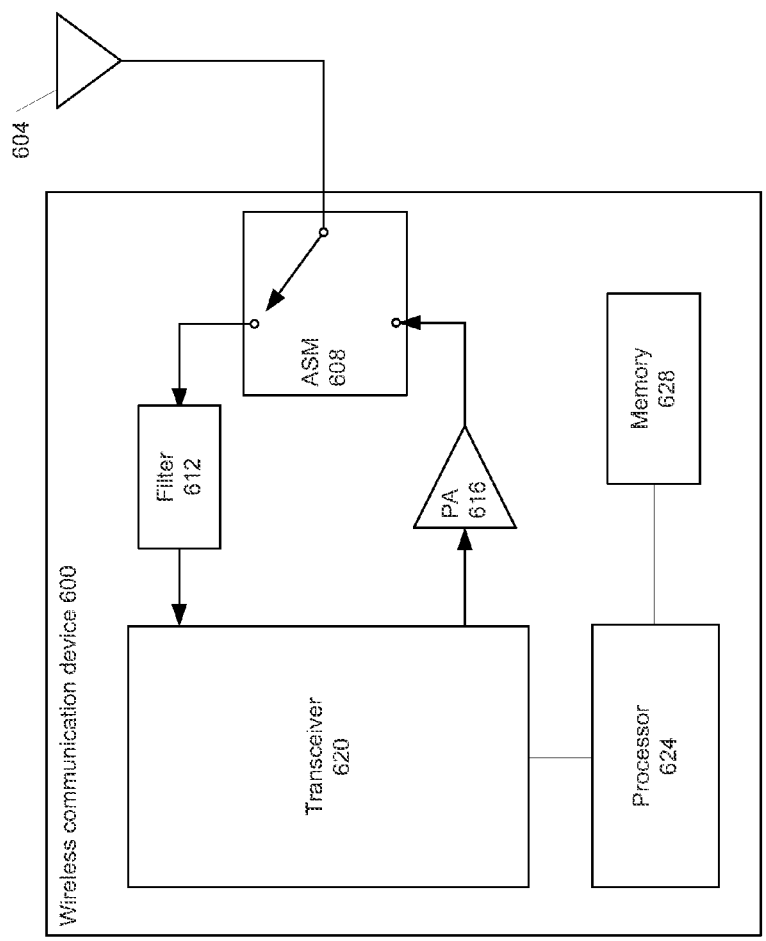
FIG. 6 illustrates a wireless communication device in accordance with some embodiments.

A wireless communication device 600 is illustrated in FIG. 6 in accordance with some embodiments. The wireless communication device 600 may have an antenna structure 604, an antenna switch module (ASM) 608, a filter 612, a power amplifier (PA) 616, a transceiver 620, a processor 624, and a memory 628 coupled with each other at least as shown.

The antenna structure 604 may include one or more antennas to transmit and receive radio frequency (RF) signals over the air. The antenna structure 604 may be coupled with the ASM 608 that operates to selectively couple the antenna structure with the filter 612 or the PA 616. When receiving incoming RF signals, the ASM 608 may couple the antenna structure 604 with the filter 612. The filter 612 may include one or more BAW resonators, such as BAW resonator 100, 300, or 400. In some embodiments, the filter 612 may include a first plurality of series BAW resonators and a second plurality of shunt BAW resonators. The filter 612 may filter the RF signals received from the ASM 608 and pass portions of the RF signals within a predetermined bandpass to the transceiver 620.

When transmitting outgoing RF signals, the ASM 608 may couple the antenna structure 604 with the PA 616. The PA 616 may receive RF signals from the transceiver 620, amplify the RF signals, and provide the RF signals to the antenna structure 604 for over-the-air transmission.

The processor 624 may execute a basic operating system program, stored in the memory 628, in order to control the overall operation of the wireless communication device 600. For example, the main processor 624 may control the reception of signals and the transmission of signals by transceiver 620. The main processor 624 may be capable of executing other processes and programs resident in the memory 628 and may move data into or out of memory 628, as desired by an executing process.

The transceiver 620 may receive outgoing data (e.g., voice data, web data, e-mail, signaling data, etc.) from the processor 624, may generate RF signals to represent the outgoing data, and provide the RF signals to the PA 616. Conversely, the transceiver 620 may receive RF signals from the filter 612 that represent incoming data. The transceiver 620 may process the RF signals and send incoming signals to the processor 624 for further processing.

In various embodiments, the wireless communication device 600 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 600 is given by way of example and that, for simplicity and clarity, only so much of the construction and operation of the wireless communication device 600 as is necessary for an understanding of the embodiments is shown and described. Various embodiments contemplate any suitable component or combination of components performing any suitable tasks in association with wireless communication device 600, according to particular needs. Moreover, it is understood that the wireless communication device 600 should not be construed to limit the types of devices in which embodiments may be implemented.

Various example embodiments are described below.

Example 1 includes a solidly-mounted bulk acoustic wave resonator comprising: an internal region, a border region, and an external region; a piezoelectric layer disposed in the internal region, the border region, and the external region; a first electrode coupled with a first surface of the piezoelectric layer and disposed in the internal region and the border region; an extension coupled with the first surface of the piezoelectric layer and disposed in the external region, the extension having an acoustic impedance that is at least similar to an acoustic impedance of the first electrode; and a second electrode coupled with a second surface of the piezoelectric layer, the second surface being opposite the first surface.

Example 2 includes the solidly-mounted BAW resonator of example 1, wherein the first electrode is a top electrode and comprises aluminum copper and the extension comprises silicon oxide.

Example 3 includes the solidly-mounted BAW resonator of example 2, wherein the first electrode consists of aluminum copper.

Example 4 includes the solidly-mounted BAW resonator of example 1, wherein the first electrode is a top electrode and comprises molybdenum and the extension comprises hafnium oxide.

Example 5 includes the solidly-mounted BAW resonator of example 4, wherein the first electrode consists of molybdenum.

Example 6 includes the solidly-mounted BAW resonator of example 1, wherein the extension is a first extension, the first electrode is a top electrode, the second electrode is a bottom electrode, and the BAW resonator further comprises: a second extension directly coupled with the second surface of the piezoelectric layer and disposed in the external region, the second extension having an acoustic impedance that is at least similar to an acoustic impedance of the second electrode.

Example 7 the solidly-mounted BAW resonator or example 6, wherein both the second extension and the second electrode include a tungsten layer and an aluminum copper layer.

Example 8 the solidly-mounted BAW resonator of example 7, wherein the top electrode comprises aluminum copper and has a thickness of approximately 200 nanometers, the tungsten layer has a thickness of approximately 70 nanometers, and the aluminum copper layer has a thickness of approximately 190 nanometers.

Example 9 the solidly-mounted BAW resonator of example 8, wherein a difference between an anti-resonance frequency of the external region and an anti-resonance frequency of the active region is approximately 57 megahertz.

Example 10 includes the solidly-mounted BAW resonator of example 8, wherein a difference between a resonance frequency of the border region and a resonance frequency of the active region is approximately 40 megahertz and a width of the border region is approximately 2.0 microns.

Example 11 includes the solidly-mounted BAW resonator of example 7, wherein the top electrode comprises molybdenum and has a thickness of approximately 215 nanometers, the piezoelectric layer has a thickness of approximately 1200 nanometers, the tungsten layer has a thickness of approximately 184 nanometers, and the aluminum copper layer has a thickness of approximately 100 nanometers.

Example 12 includes the solidly-mounted BAW resonator of example 11, wherein a difference between an anti-resonance frequency of the external region and an anti-resonance frequency of the active region is approximately 196 megahertz.

Example 13 includes the solidly-mounted BAW resonator of example 11, wherein a difference between a resonance frequency of the border region and a resonance frequency of the active region is approximately 40 megahertz and a width of the border region is approximately 2.0 microns.

Example 14 includes the solidly-mounted BAW resonator of example 7, wherein: the top electrode comprises molybdenum and has a thickness of approximately 200 nanometers; the piezoelectric layer has a thickness of approximately 1200 nanometers; the tungsten layer has a thickness of approximately 170 nanometers; the aluminum copper layer has a thickness of approximately 250 nanometers; a difference between an anti-resonance frequency of the external region and an anti-resonance frequency of the active region is approximately 49 megahertz; a difference between a resonance frequency of the border region and the resonance frequency of the active region is approximately 130 megahertz; and a width of the border region is approximately 0.25 microns.

Example 15 includes the solidly-mounted BAW resonator of example 8, further comprising: a reflector having a plurality of tungsten layers disposed in silicon oxide coupled with the piezoelectric layer.

Example 16 includes the solidly-mounted BAW resonator, of example 1, wherein the extension is a dielectric material.

Example 17 includes the solidly-mounted BAW resonator of example 1, further comprising: a top electrode including the first electrode or the second electrode; and a mass load coupled with the top electrode in the border region.

Example 18 includes the solidly-mounted BAW resonator of example 17, wherein the top electrode includes the first electrode and the mass load is further coupled with the extension in the external region.

Example 19 includes a system comprising: a transceiver to transmit and receive radio frequency signals; a filter coupled with the transceiver and configured to filter RF signals provided to the transceiver; a power amplifier coupled with the transceiver and configured to amplify RF signals received from the transceiver; an antenna structure to transmit and receive RF signals over the air; and an antenna switch module to selective couple the antenna structure with the filter and the power amplifier, wherein the filter includes a bulk acoustic wave (BAW) resonator having: first and second electrodes coupled with a piezoelectric material; and an extension adjacent to the first electrode and having an acoustic impedance that is at least similar to an acoustic impedance of the first electrode.

Example 20 includes the system of example 19, wherein the first electrode is a top electrode that comprises aluminum copper and the extension comprises silicon dioxide.

Example 21 includes the system of example 19, wherein the first electrode is a top electrode that comprises molybdenum and the extension comprises hafnium dioxide.

Example 22 includes the system of example 19, wherein the first electrode is a bottom electrode that comprises an aluminum copper layer and a tungsten layer and the extension comprises an aluminum copper layer and a tungsten layer.

Example 23 includes the system of example 19, wherein the BAW resonator comprises an active region, a border region, and an external region, and the extension is disposed in the external region.

Example 24 includes a method of manufacturing a bulk acoustic wave (BAW) resonator comprising: forming a piezoelectric layer with a first surface and a second surface; forming a first electrode at a first surface of the piezoelectric layer; forming a second electrode at a second surface of the piezoelectric layer; and forming an extension, that is acoustically similar to the first electrode, at the first surface adjacent to the first electrode.

Example 25 includes the method of example 24, further comprising: forming the first electrode of aluminum copper and forming the extension of silicon dioxide.

Example 26 includes the method of example 24, further comprising: forming the first electrode of molybdenum and forming the extension of hafnium oxide.

Example 27 includes the method of example 24, wherein the extension is a first extension and the method further comprises: forming a second extension at the second surface of the piezoelectric layer adjacent the second electrode, wherein the first and second extensions are in an external region of the BAW resonator.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A solidly mounted bulk acoustic wave (BAW) resonator comprising:
  a Bragg reflector;
  a plurality of layers over the Bragg reflector and comprising a piezoelectric layer between a first electrode comprising tungsten and a second electrode that does not comprise tungsten;
  a mass load over the plurality of layers and defining a border region within the plurality of layers and below the mass load, wherein:
    an internal region is defined between the first electrode and the second electrode, within the plurality of layers and inside of the border region such that the first electrode and the second electrode reside in the internal region; and an external region is defined within the plurality of layers and outside of the border region; and an extension that resides against the piezoelectric layer in the external region and is directly coupled to a side edge of the second electrode, wherein acoustic impedances of the second electrode and the extension are at least similar.

2. The solidly mounted BAW resonator of claim 1 wherein an electrical response has essentially no border ring mode outside of a bandpass caused by the mass load.

3. The solidly mounted BAW resonator of claim 2 wherein the electrical response has essentially no spurious modes within the bandpass caused by lateral acoustic waves.

4. The solidly mounted BAW resonator of claim 1 wherein the first electrode extends from the internal region through the border region and into the external region and the second electrode does not extend into the external region.

5. The solidly mounted BAW resonator of claim 4 wherein the electrical response has essentially no border ring mode outside of a bandpass caused by the mass load.

6. The solidly mounted BAW resonator of claim 5 wherein an electrical response has essentially no spurious modes within the bandpass caused by lateral acoustic waves.

7. The solidly mounted BAW resonator of claim 1 wherein the first electrode comprises a tungsten layer and a non-tungsten layer such that the tungsten layer resides between the non-tungsten layer and the piezoelectric layer.

8. The solidly mounted BAW resonator of claim 7 wherein the first electrode extends from the internal region through the border region and into the external region and the second electrode does not extend into the external region.

9. The solidly mounted BAW resonator of claim 8 wherein the electrical response has essentially no border ring mode outside of a bandpass caused by the mass load.

10. The solidly mounted BAW resonator of claim 9 wherein the electrical response has essentially no spurious modes within the bandpass caused by lateral acoustic waves.

11. The solidly mounted BAW resonator of claim 1 wherein the first electrode resides between the Bragg reflector and the piezoelectric layer.

12. The solidly mounted BAW resonator of claim 1 wherein the extension comprises at least one of the group consisting of silicon oxide and hafnium oxide.

13. The solidly mounted BAW resonator of claim 1 wherein the second electrode comprises molybdenum and the extension comprises hafnium oxide.

14. The solidly mounted BAW resonator of claim 1 wherein the second electrode comprises aluminum copper and the extension comprises silicon oxide.

15. The solidly mounted BAW resonator of claim 1, wherein the acoustic impedance of the extension is between approximately 70% and approximately 130% of the acoustic impedance of the second electrode.

16. A solidly-mounted bulk acoustic wave (BAW) resonator comprising:

an internal region, a border region, and an external region;

a piezoelectric layer disposed in the internal region, the border region, and the external region; a top electrode coupled with a first surface of the piezoelectric layer and disposed in the internal region and the border region;

a first extension coupled with the first surface of the piezoelectric layer and disposed in the external region, the first extension having an acoustic impedance that is at least similar to an acoustic impedance of the top electrode;

a bottom electrode coupled with a second surface of the piezoelectric layer, the second surface being opposite the first surface; and a second extension directly coupled with the second surface of the piezoelectric layer and disposed in the external region, the second extension having an acoustic impedance that is at least similar to an acoustic impedance of the bottom electrode, wherein:

both the second extension and the bottom electrode include a tungsten layer and an aluminum copper layer;

the top electrode comprises aluminum copper and has a thickness of approximately 200 nanometers; the tungsten layer has a thickness of approximately 70 nanometers; and the aluminum copper layer has a thickness of approximately 190 nanometers.

17. The solidly-mounted BAW resonator of claim 16, wherein a difference between an anti-resonance frequency of the external region and an anti-resonance frequency of the internal active region is approximately 57 megahertz.

18. The solidly-mounted BAW resonator of claim 16, wherein a difference between a resonance frequency of the border region and a resonance frequency of the internal active region is approximately 40 megahertz and a width of the border region is approximately 2.0 microns.

19. The solidly-mounted BAW resonator of claim 16, further comprising:

a reflector having a plurality of tungsten layers disposed in silicon oxide coupled with the piezoelectric layer.

20. A solidly-mounted bulk acoustic wave (BAW) resonator comprising:

an internal region, a border region, and an external region;

a piezoelectric layer disposed in the internal region, the border region, and the external region; a top electrode coupled with a first surface of the piezoelectric layer and disposed in the internal region and the border region;

a first extension coupled with the first surface of the piezoelectric layer and disposed in the external region, the first extension having an acoustic impedance that is at least similar to an acoustic impedance of the top electrode;

a bottom electrode coupled with a second surface of the piezoelectric layer, the second surface being opposite the first surface; and a second extension directly coupled with the second surface of the piezoelectric layer and disposed in the external region, the second extension having an acoustic impedance that is at least similar to an acoustic impedance of the bottom electrode, wherein:

both the second extension and the bottom electrode include a tungsten layer and an aluminum copper layer;

the top electrode comprises molybdenum and has a thickness of approximately 215 nanometers; the piezoelectric layer has a thickness of approximately 1200 nanometers; the tungsten layer has a thickness of approximately 184 nanometers; and the aluminum copper layer has a thickness of approximately 100 nanometers.

21. The solidly-mounted BAW resonator of claim 20, wherein a difference between an anti-resonance frequency of the external region and an anti-resonance frequency of the internal active region is approximately 196 megahertz.

22. The solidly-mounted BAW resonator of claim 20, wherein a difference between a resonance frequency of the border region and a resonance frequency of the internal active region is approximately 40 megahertz and a width of the border region is approximately 2.0 microns.

23. A solidly-mounted bulk acoustic wave resonator comprising:
an internal region, a border region, and an external region;
a piezoelectric layer disposed in the internal region, the border region, and the external region; a top electrode coupled with a first surface of the piezoelectric layer and disposed in the internal region and the border region;
a first extension coupled with the first surface of the piezoelectric layer and disposed in the external region, the first extension having an acoustic impedance that is at least similar to an acoustic impedance of the top electrode;
a bottom electrode coupled with a second surface of the piezoelectric layer, the second surface being opposite the first surface; and
a second extension directly coupled with the second surface of the piezoelectric layer and disposed in the external region, the second extension having an acoustic impedance that is at least similar to an acoustic impedance of the bottom electrode, wherein:
both the second extension and the bottom electrode include a tungsten layer and an aluminum copper layer;
the top electrode comprises molybdenum and has a thickness of approximately 200 nanometers;
the piezoelectric layer has a thickness of approximately 1200 nanometers;
the tungsten layer has a thickness of approximately 170 nanometers;
the aluminum copper layer has a thickness of approximately 250 nanometers;
a difference between an anti-resonance frequency of the external region and an anti-resonance frequency of the internal active region is approximately 49 megahertz;
a difference between a resonance frequency of the border region and the resonance frequency of the internal active region is approximately 130 megahertz; and
a width of the border region is approximately 0.25 microns.

24. A system comprising:
a transceiver to transmit and receive radio frequency (RF) signals;
a filter coupled with the transceiver and configured to filter the RF signals provided to the transceiver;
a power amplifier coupled with the transceiver and configured to amplify the RF signals received from the transceiver;
an antenna structure to transmit and receive the RF signals over air; and
an antenna switch module to selectively couple the antenna structure with the filter and the power amplifier,
wherein the filter includes a bulk acoustic wave (BAW) resonator having:
a Bragg reflector;
a plurality of layers over the Bragg reflector and comprising a piezoelectric layer between a first electrode comprising tungsten and a second electrode that does not comprise tungsten;
a mass load over the plurality of layers and defining a border region within the plurality of layers and below the mass load, wherein:
an internal region is defined between the first electrode and the second electrode, within the plurality of layers and inside of the border region such that the first electrode and the second electrode reside in the internal region; and
an external region is defined within the plurality of layers and outside of the border region; and
an extension that resides against the piezoelectric layer in the external region and is directly coupled to a side edge of the second electrode, wherein acoustic impedances of the second electrode and the extension are at least similar.

25. The system of claim 24 wherein an electrical response of the BAW resonator has essentially no border ring mode outside of a bandpass caused by the mass load.

26. The system of claim 25 wherein an electrical response of the BAW resonator has essentially no spurious modes within a bandpass caused by lateral acoustic waves.

27. The system of claim 24 wherein the first electrode comprises a tungsten layer and a non-tungsten layer such that the tungsten layer resides between the non-tungsten layer and the piezoelectric layer.

28. The system of claim 27 wherein the first electrode extends from the internal region through the border region and into the external region and the second electrode does not extend into the external region.

* * * * *